United States Patent
Ringe et al.

(10) Patent No.: US 7,200,173 B2
(45) Date of Patent: Apr. 3, 2007

(54) METHOD AND APPARATUS FOR GENERATING A DISTORTIONLESS PULSE WIDTH MODULATED WAVEFORM

(76) Inventors: Tushar Prakash Ringe, 89 Jankinagar (Main), Indore 452001 (IN); Sourav Roy, 6A Basudevpur Road, Kolkata700061 (IN)

(*) Notice: Subject to any disclaimer, the term of this patent is extended or adjusted under 35 U.S.C. 154(b) by 107 days.

(21) Appl. No.: 10/694,452

(22) Filed: Oct. 27, 2003

(65) Prior Publication Data

US 2005/0089090 A1    Apr. 28, 2005

(51) Int. Cl.
*H03K 7/08*    (2006.01)
*H03K 9/08*    (2006.01)

(52) U.S. Cl. ........................ 375/238; 332/109
(58) Field of Classification Search ........... 332/109; 375/238; 370/212
See application file for complete search history.

(56) References Cited

U.S. PATENT DOCUMENTS

| | | | | |
|---|---|---|---|---|
| 5,144,265 A | * | 9/1992 | Petzold | 332/109 |
| 5,589,805 A | * | 12/1996 | Zuraski et al. | 332/109 |
| 6,157,671 A | * | 12/2000 | Young | 375/238 |
| 6,226,324 B1 | * | 5/2001 | Allstrom | 375/238 |
| 6,472,946 B2 | * | 10/2002 | Takagi | 332/109 |
| 6,487,246 B1 | * | 11/2002 | Hoeld | 375/238 |
| 2002/0017962 A1 | * | 2/2002 | Takagi | 332/109 |
| 2003/0088724 A1 | * | 5/2003 | Itoh et al. | 710/262 |

FOREIGN PATENT DOCUMENTS

WO    WO-05046056 A2    5/2005

OTHER PUBLICATIONS

"Copy of the International Search Report", PCT/US04/35173 Dated Mar. 29, 2005 4 Pages.
"Copy of the Written Opinion of the International Search Authority", PCT/US04/35173 Dated Mar. 29, 2005 5 Pages.

* cited by examiner

*Primary Examiner*—Jean B. Corrielus
(74) *Attorney, Agent, or Firm*—Global IP Services, PLLC; Prakash Nama

(57) ABSTRACT

A technique to provide a distortionless and predictable real-time PWM waveform based on a sequence of combinations of programmed period and width values received from a processor. In one example embodiment, this is accomplished by using two sets of registers to store the period and width values and a tertiary period register to further store the period value with their associated timing controls to provide the predictable real-time PWM waveform.

26 Claims, 5 Drawing Sheets

METHOD AND APPARATUS FOR GENERATING A DISTORTIONLESS PULSE WIDTH MODULATED WAVEFORM

TECHNICAL FIELD OF THE INVENTION

The present invention relates generally to generating a pulse signal, and more particularly to generating a pulse width modulated (PWM) waveform.

BACKGROUND OF THE INVENTION

Pulse width modulated (PWM) signal generators are used in many kinds of circuits, including embedded controllers, audio processors, and motor control circuits. In general, a PWM signal generator employs a phase-locked loop circuit that generates a rectangular clock signal from a system clock signal and a PWM controller for producing a PWM signal from the rectangular clock signal and a modulating signal. In general the PWM controller is peripheral to a processor and can module the PWM signal by changing period and width values from a user program.

In the case where both period and width values of a PWM signal are to be controlled, it is necessary for the processor to manage the timing of the write of both the period and width values so as to prevent the PWM signal from being generated at undesired times and combinations of period and width values. In addition, changing the period and width values on-the-fly can result in distortion in the form of undesired timing of the PWM waveform and can also result in undesired combinations of period and width values. These drawbacks can make the current PWM waveform generators unsuitable for critical real-time applications.

A type of current PWM waveform generator, which attempts to generate a reliable PWM waveform when both the period and width values are to be controlled, generates a PWM signal depending on a sequence of combinations of period set and width set values which are received from a controller. The above PWM waveform generator utilizes two registers for the period value and another two registers for the width value. A write history flag controls a transfer permit signal to move the period and width values from one set of registers to the next.

One potential problem with the above PWM waveform generator is that it fails to generate the desired waveform when the period and width updates/changes occur on opposite sides of a PWM cycle boundary. Further, the technique does not respond to the updates to provide desired wave forms when the period and width updates continue to occur on opposite sides of the PWM cycle boundary in successive PWM cycles. When generating a PWM waveform, period and/or width updates occur generally in almost every cycle of a PWM signal. If the period and width updates occur on opposite sides of the PWM cycle boundary in each cycle of the PWM signal, then the updates/changes never get implemented by the above-described PWM waveform generator.

It is generally difficult to control the updates to occur at a desired location in a PWM waveform cycle (to occur simultaneously or within a PWM cycle boundary) sequentially when writing to the registers using software running on a processor. It is even more difficult, when using a software program running on a processor, to control the period and width updates to occur at a desired location when the changes have to be made on-the-fly. In addition, adding extra features to the software to monitor and control the timing of the period and width updates increases the load on the processor when the processor is in operation. Therefore, the technique falls short of reliably generating a desired real-time high frequency PWM waveform.

SUMMARY OF THE INVENTION

The present invention provides a technique to generate a distortionless, reliable, and predictable real-time PWM waveform based on a sequence of combinations of programmed period and width values received from a processor. In one example embodiment, this is accomplished by storing current period and width values in primary period and width registers, respectively, upon receiving period and width write signals. A secondary period value is then computed using the period and width values. Further, the width value and the secondary period value stored in secondary width and period registers, respectively, upon receiving the width write signal. A down-counter is then with the width value and then the secondary period value is stored in a tertiary period register. The width value is then counted down in each clock cycle until the width value reaches zero and an expired width signal is outputted and then the secondary period value is loaded. The secondary period value is then counted down in each clock cycle until it reaches zero and an expired period signal is outputted. A PWM signal is then generated based on the expired period and width signals. The process described-above repeats itself for a next set of period and width values received from the processor.

DETAILED DESCRIPTION OF THE INVENTION

The present subject matter provides an architecture to generate a distortionless and predictable real-time PWM waveform based on a sequence of combinations of programmed period and width values received from a processor. In one example embodiment, the PWM waveform is generated using a programmable pulse width modulated (PWM) waveform generator to generate a distortionless and reliable PWM signal having desired combination of width and period. The PWM generator is peripheral to a digital signal processor (DSP), which can change period and width values on-the-fly. This PWM waveform generator is suitable for critical real-time applications where the DSP needs to generate a predictable PWM waveform. This is accomplished by using two sets of registers to store period and width values and a special tertiary period register for the period value with its timing control. This architecture can also generate a PWM waveform having a width of one clock cycle and a period of two clock cycles on a real-time basis without any distortion. All of the above features are achieved with a minimal increase in hardware over the current techniques.

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The terms "cycle" and "period" are used interchangeably throughout the document. In addition, the terms "width" and "duty" are used interchangeably throughout the document. Also, the terms "storage element" and "register" mean the same and refer to a memory element. In addition, the terms "write" and "update" are used interchangeably throughout the document. Further, the term "clock cycle" means system clock cycle. The term "processor" means "digital signal processor", "microcontroller", "audio processor", "microprocessor", and so on.

Figure 1:
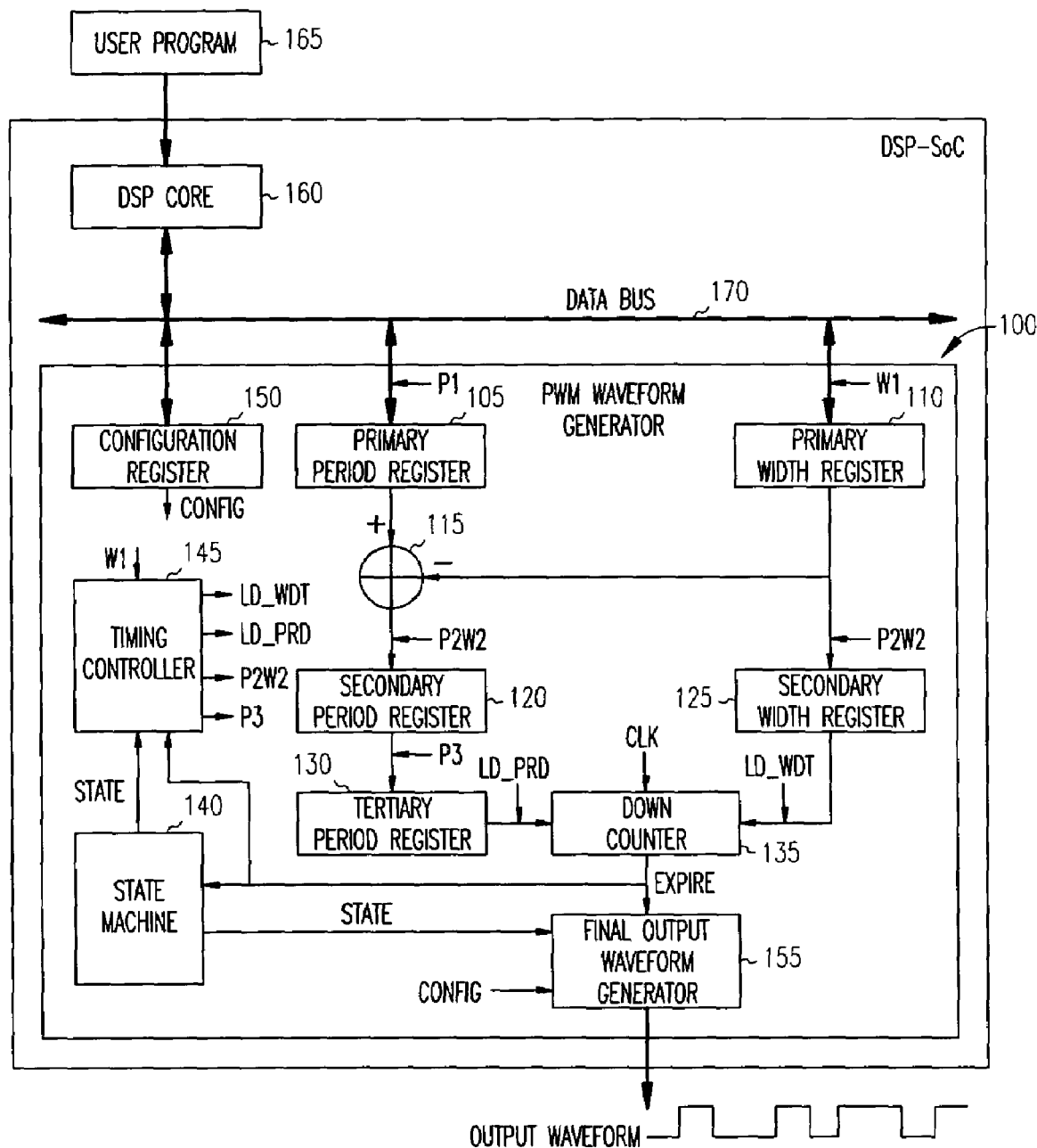
FIG. 1 is a block diagram of one example embodiment of a PWM waveform generator.

Referring now to FIG. 1, there is illustrated an example embodiment of a PWM waveform generator 100 according to the present subject matter. The PWM waveform generator 100 includes a primary period register 105 and a primary width register 110. In some embodiments, the primary period register 105 and the primary width register 110 are memory-mapped registers. The PWM waveform generator 100 further includes a subtractor 115 coupled to the primary period register 105 and the primary width register 110. The PWM waveform generator 100 also includes a secondary period register 120 coupled to the subtractor 115 and a secondary width register 125 coupled to the primary width register 110.

As shown in FIG. 1, the PWM waveform generator 100 further includes a tertiary period register 130, a down-counter 135, a state machine 140, a timing controller 145, a configuration register 150, and a final output waveform generator 155. Also as shown in FIG. 1, the PWM waveform generator 100 further includes a DSP core 160 operatively coupled to receive program instructions from a user program 165. Further as shown in FIG. 1, the DSP core 160 is coupled to the PWM waveform generator 100 via a data bus 170. Furthermore as shown in FIG. 1, the PWM waveform generator 100 and the DSP core 160 are components of a DSP system-on-chip (SoC).

In operation, in one example embodiment, when a user program 165 executing on the DSP core 160 changes period and width values in the PWM waveform generator 100, the current period and width values are stored in the primary period and width registers 105 and 110, respectively, upon receiving a primary period register write signal and a primary width register write signal, respectively, from the user program 165. In some embodiments, the primary period and width registers 105 and 110 receive the current period and width values and the associated primary register write signals via the data bus 170.

The subtractor 115 then receives the width value from the primary width register 110 and the period value from the primary period register 105 and computes a secondary period value using the received width and period values.

The down-counter 135 counts down the loaded programmed width value with each clock cycle until it reaches zero and generates an EXPIRE signal when the down-counter reaches zero. The state machine 140 generates a state value based on the EXPIRE signal. (The generation of the EXPIRE signal and the state value is explained in more detail with reference to FIG. 2). In some embodiments, the state machine 140 receives the EXPIRE signal from the down-counter 135 and outputs the state value. The EXPIRE signal along with the state value is used to generate expired width and expired period signals.

The timing controller 145 then generates a secondary storage element write control signal upon receiving the primary width register write signal from the user program 165. The timing controller 145 further generates a tertiary period register write signal based on the EXPIRE signal received from the down-counter 135 and the state value from the state machine 140. The tertiary period register write signal is a single clock-cycle pulse at a current PWM cycle boundary. The EXPIRE signal along with the state value is used internally by the timing controller 145 and the final output waveform generator 155 to produce expired width and expired period signals. In addition, the timing controller 145 further generates the width update counter signal based on the expired period signal and a period update counter signal based on the expired width signal. In these embodiments, the width update counter signal and the tertiary period register write signal are same signals in the temporal domain.

The secondary period and width registers 120 and 125 store the secondary period and width values, respectively, upon receiving the secondary storage element write control signal from timing controller 145. The tertiary period register 130 receives the secondary period value from the secondary period register 120 upon receiving the tertiary period register write signal and stores the secondary period value in the tertiary period register 130.

The down-counter 135 then receives the width value from the secondary width register 125 upon receiving the width update counter signal from the timing controller 145 and generates an EXPIRE signal based on the width value. This EXPIRE signal corresponds to the expired width signal. The down-counter 135 to further receive the secondary period value from the tertiary period register 130 upon generating the EXPIRE signal, and again generates the EXPIRE signal based on the period value. This EXPIRE signal corresponds to the expired period signal. In some embodiments, the down-counter 135 counts down the loaded programmed width value with each clock cycle until the down-counter reaches zero and then generates the expired width signal. Also in these embodiments, the down-counter 135 counts down the loaded programmed secondary period value with each clock cycle until the down-counter reaches zero and then generates the EXPIRE signal.

The final output waveform generator 155 then receives the EXPIRE signal from the down-counter 135 and the state value from the state machine 140 to internally generate the expired period and width signals. The final output waveform generator 155 then generates a PWM signal on a real-time basis as a function of expired period and width signals. The configuration register 150 receives a control signal from the user program 165 and outputs a configuration signal. The final output waveform generator 155 generates the PWM signal or its inverse based on the configuration signal. In these embodiments, the final output waveform generator 155 outputs a PWM signal based on the expired period and width signals and the configuration signal. Also in these embodiments, the final output waveform generator 155 generates a PWM waveform having a width of 1 clock cycle and a period of 2 clock cycles. In some embodiments, the final output waveform generator 155 outputs the PWM signal based on the expired period signal, the expired width signal, the state value, and the configuration signal.

Figure 2:
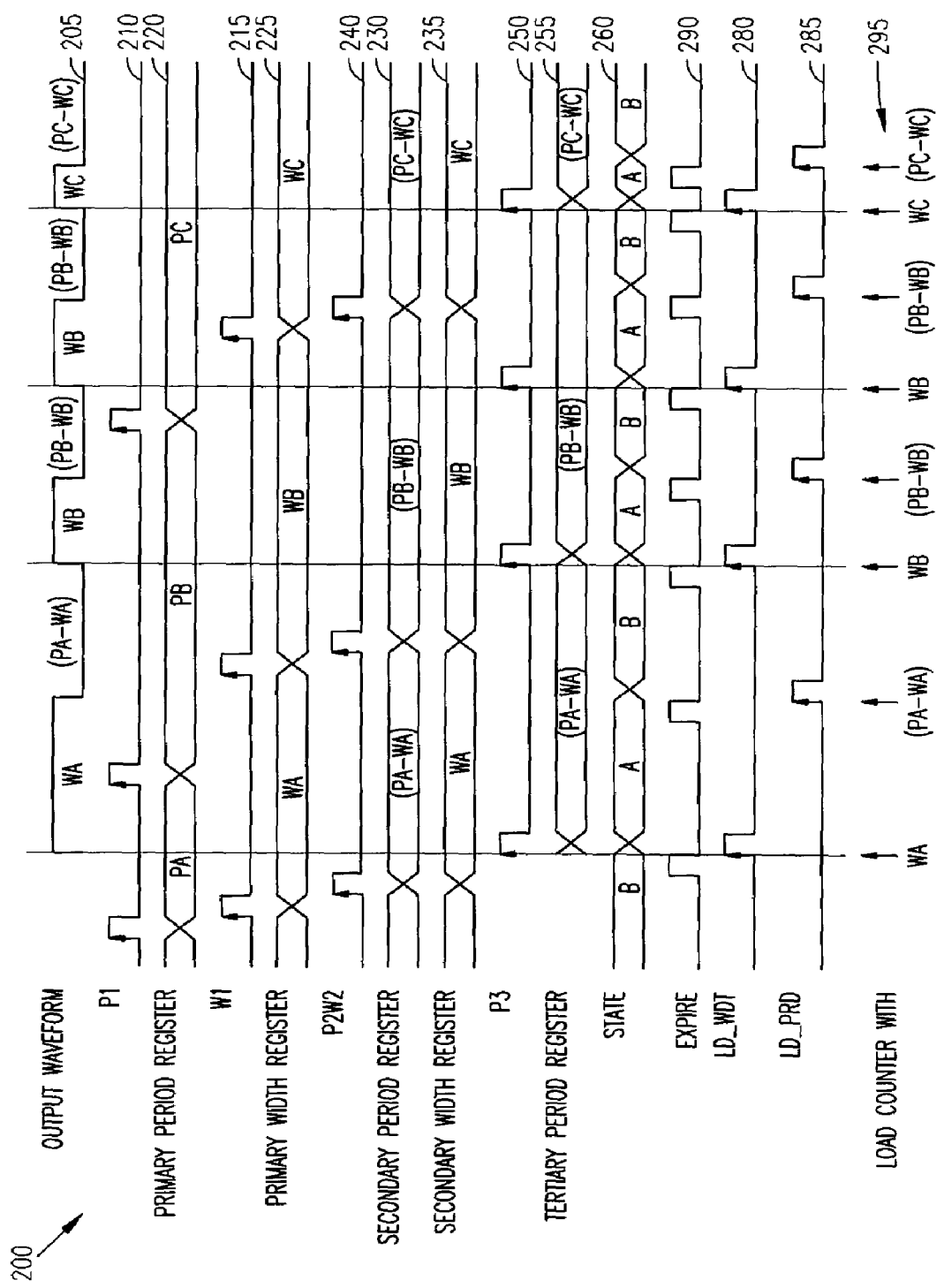
FIG. 2 is a timing diagram illustrating all timing signals generated using the PWM waveform generator shown in FIG. 1.

Referring now to FIG. 2, there is illustrated all the timing signals 200 generated, using the PWM waveform generator shown in FIG. 1, according to an embodiment of the present invention. Dataflow through the primary period and width registers 105 and 110, the secondary period and width registers 120 and 125, and the tertiary period register 130 are controlled by the timing signals based on the time when the period and width values are updated by the user and also based on the state of the state-machine 140. The down-counter 135 operates on the secondary width value and the tertiary period value. The final output waveform generator 155 either outputs a logic one or logic high, depending on the state. The state of the state machine 140 changes from state A to state B and vice-versa, as shown in timing signal 260 in FIG. 2, when the down-counter 135 reaches zero. It can be envisioned that an up-counter, in place of the down-counter, is used when using inverted values of period and width, though they are conceptually same.

FIG. 2 further shows the generated output PWM waveform 205. The primary period and width write signals are generated as indicated in timing signals P1 and W1 210 and 215, respectively. In some embodiments, the user updates the period value first as indicated in the timing signal 210. Once the user updates the period value, the width value must also be updated as shown in the timing signals 210 and 215. The PWM waveform generator 100 (shown in FIG. 1) can update only the width, which may be necessary in many cases, such as communication related to PWM, where the period value corresponds to a constant sampling period. In these embodiments, updating the width value is what actually transfers the period and width values to their respective secondary period and width registers 120 and 125 from the primary period and width registers 105 and 110 (shown in FIG. 1), respectively, on a next clock cycle as shown in timing signals 230, 235, 220, and 225. The transfer of the period and width values from the primary registers to the secondary registers are based on receiving the secondary storage element write control signal as illustrated using timing signal P2W2 240. The secondary period register 120 actually gets the computed secondary period value (period value—width value). It can be seen in FIG. 2 that the primary period and primary width updates can occur within a PWM signal boundary or can occur across a PWM signal boundary.

In a PWM cycle, initially a logic high is generated for a specific number of clock cycles corresponding to the width value. Subsequent to generating the logic high, a logic low is generated for a period of secondary period value clock cycles. The state machine 140 is in state A in the former case and in state B in the latter case as shown in the timing signal 260. A control bit, when set can generate a configuration signal, which in turn can generate a logic low corresponding to state A and a logic high corresponding to state B. At the beginning of state A the tertiary period register 130 is loaded with the secondary period register value as shown in timing signal 255. This corresponds to timing signal P3 250. The tertiary period register 130 prevents any period change to go to the down-counter 135 during a current PWM cycle. Also, the down-counter 135 loads the secondary width register value corresponding to the width update counter signal LD_WDT 280 and starts counting down until the down-counter reaches a value of zero. In the last counting cycle, EXPIRE signal 270 is generated as shown in timing signal 280. This corresponds to the expired width signal. At the end of state A, state B starts and the down-counter 135 is loaded with the tertiary period register value corresponding to the period update counter signal LD_PRD as shown in timing signals 260 and 285. Again, the down-counter 135 counts down until it reaches a value of zero. Now it again generates the EXPIRE signal as shown in the timing signal 290. This corresponds to the expired period signal. Hence, the down-counter 135 loads the width value when the EXPIRE signal is generated in state B as shown in timing signals 290 and 295. Similarly, the down-counter 135 loads a value of (period-width), i.e., the secondary period value when the EXPIRE signal is generated in state A. At other times for every clock period the down-counter decrements the count by unity. This ends a complete period of the output PWM waveform. This mechanism permits high frequency PWM waveforms to be generated from a DSP on-the-fly without any distortion. Adding such a reliability feature to the DSP has a minimal impact on the DSP resource and a minimal increase in the DSP hardware. The above process repeats itself for a next PWM waveform generated by the PWM waveform generator 100.

Figure 3:
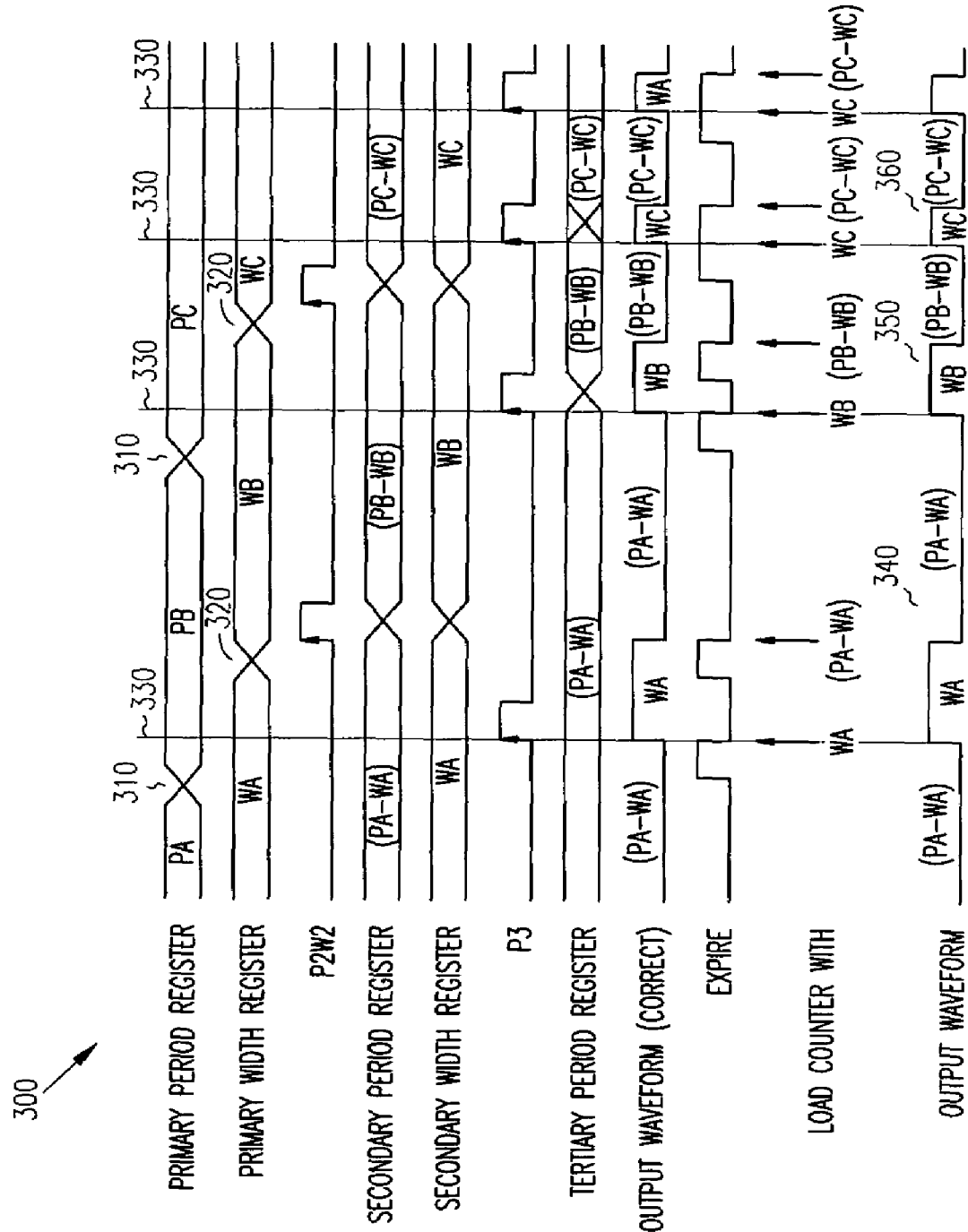
FIG. 3 is another embodiment of the timing diagram illustrating all the timing signals generated using the PWM waveform generator, when the period and width updates occur on opposite sides of a PWM cycle boundary, shown in FIG. 1.

Referring now to FIG. 3, there is illustrated all the timing signals 300, similar to the timing signals shown in FIG. 2, generated using the PWM waveform generator 100 shown in FIG. 1, according to another embodiment of the present invention. FIG. 3 shows how the present subject matter solves the reliability problem when a sequence of period and width updates/changes, such as PA, PB, and PC 310 and WA, WB, and WC 320 occur on opposite sides of, i.e., occur across, a PWM cycle boundary 330. The generation of the timing signals shown in FIG. 3 clearly illustrate the generation of the PWM waveform without any distortion when the period and width updates/changes 310 and 320 occur across the PWM cycle boundary 330 in a sequence as shown in PWM cycles 340, 350, and 360.

Figure 4:
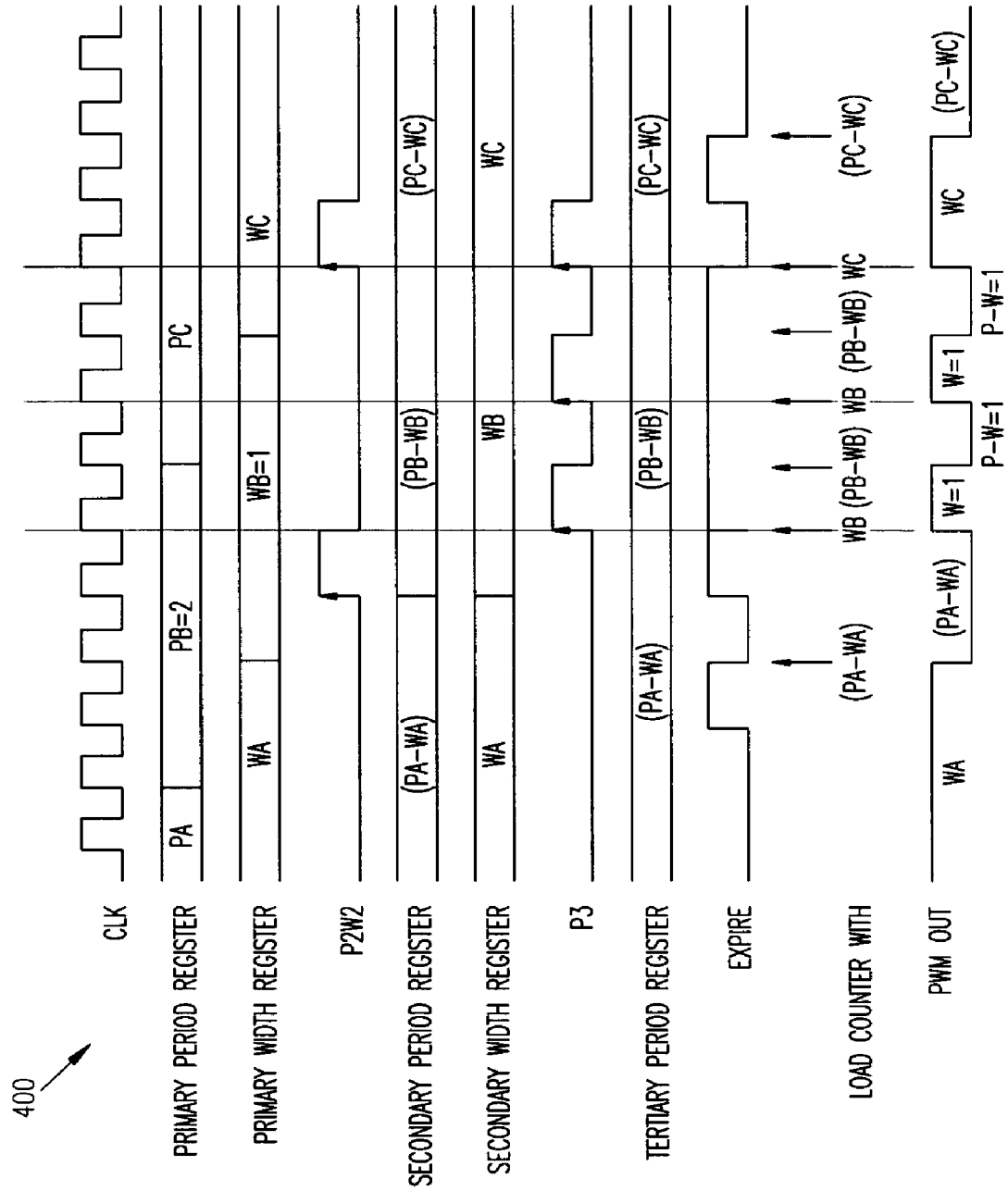
FIG. 4 is another embodiment of the timing diagram illustrating all the timing signals generated using the PWM waveform generator, when generating a lowest possible PWM cycle period, shown in FIG. 1.

Referring now to FIG. 4, there is illustrated all the timing signals 400 generated using the PWM waveform generator shown in FIG. 1, according to an embodiment of the present invention. Again, the timing signals depicted in FIG. 4 are similar to the timing signals depicted in FIGS. 2 and 3 and the generation of these timing signals has been described in more detail with reference to FIG. 2. FIG. 4 illustrates the seamless generation of the PWM waveforms, having a width of one clock cycle and a period of two clock cycles, without any distortion.

Figure 5:
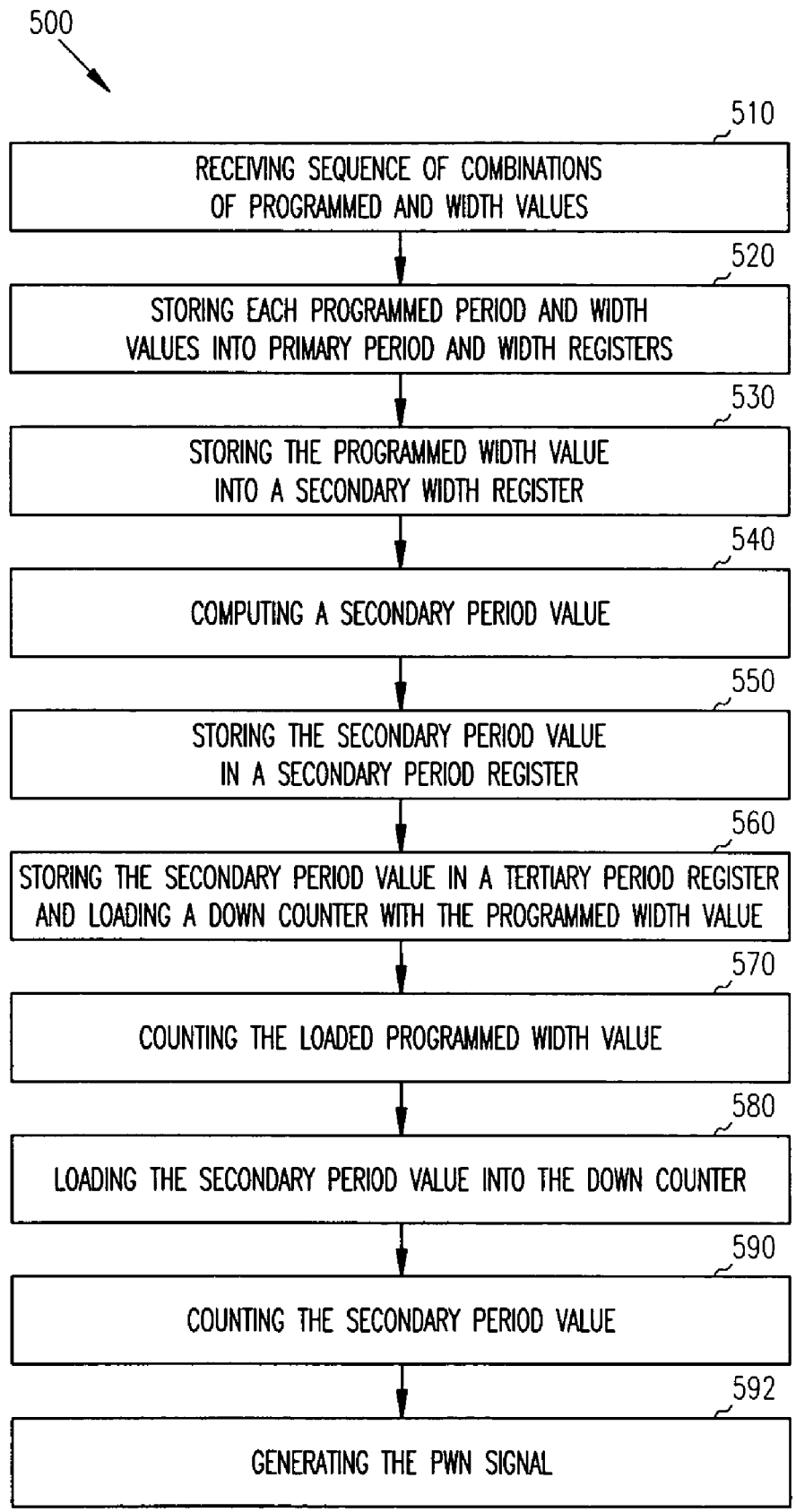
FIG. 5 is a flowchart illustrating a method of generating the distortionless PWM waveform on a real-time basis.

Referring now to FIG. 5, there is illustrated an embodiment of a method 500 according to the present invention. At 510, the method 500 in this example embodiment receives a sequence of combinations of programmed period and width values and their associated primary period and width write signals from a user program through a DSP core via a data bus. At 520, each of the received sequence of combinations of programmed period and width values are stored in primary period and width registers.

At 530, the programmed width value is stored by obtaining the programmed width value from the primary width register into a secondary width register upon receiving a secondary storage element write signal from a timing controller.

At 540, a secondary period value is computed by subtracting the programmed width value from the programmed period value. At 550, the computed secondary period value is stored into a secondary period register upon receiving a secondary storage element write control signal from the timing controller. In some embodiments, the secondary storage element write control signal is generated upon receiving the primary width register write signal. At 560, the secondary period value is further stored in a tertiary period register upon receiving a tertiary period register write signal from the timing controller.

Also at 560, a down-counter is loaded with the programmed width value by obtaining the programmed width value from the secondary width register upon receiving the width update counter write signal from the timing controller. The width update counter signal and the tertiary period register write signal are the same in the temporal domain. In some embodiments, the tertiary period register write signal is generated based on a state signal and an EXPIRE signal received from the state machine and the down-counter, respectively. At 570, the loaded programmed width value is counted down with each clock cycle and an expired width signal is produced when the down-counter reaches zero. In addition, a count width signal is generated until the expired width signal is produced.

At 580, the secondary period value is loaded into the down-counter upon producing the expired width signal and upon receiving a period update counter signal from the timing controller. At 590, the loaded secondary period value is counted down until the down-counter reaches zero and an expired period signal is produced. In addition, a count period signal is generated until the expired period signal is produced. In these embodiments, the state signal along with the EXPIRE signal is used to generate the expired period and width signals associated with the current PWM signal. The state signal includes boundary information of the current PWM signal. Also in these embodiments, the width update and period update counter signals are generated based on the state signal.

At 592, a PWM signal is generated based on the produced expired period and width signals. In some embodiments, a configuration signal is generated such that the configuration signal can generate an inverse of the PWM waveform. In these embodiments, the PWM signal is generated based on the configuration signal and the expired period and width signals. The above method 500 repeats itself for a next programmed period and width values received from the user program through the DSP core.

Although the method 500 includes blocks 510–592 that are arranged serially in the exemplary embodiments, other embodiments of the subject matter may execute two or more blocks in parallel, using multiple processors or a single processor organized two or more virtual machines or subprocessors. Moreover, still other embodiments may implement the blocks as two or more specific interconnected hardware modules with related control and data signals communicated between and through the modules, or as portions of an application-specific integrated circuit. Thus, the exemplary process flow diagrams are applicable to software, firmware, and/or hardware implementations.

The various embodiments of the PWM waveform generator, systems, and methods described herein are applicable generically to generate a distortionless and reliable PWM signal with a desired combination of period and width values. The PWM waveform generator of the present subject matter is peripheral to a digital signal processor (DSP), which can change the period and width values on a real-time basis. The PWM waveform generator described-above is highly suitable for critical real-time applications where the DSP needs to generate distortionless PWM signal. Furthermore, the above-described technique generates high-speed PWM waveforms with the highest attainable frequency of one clock cycle width and two clock cycles in a period. This further enables a highest rate of period and width updates.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. An apparatus, comprising:
   a PWM waveform generator to generate a predictable pulse width modulated (PWM) signal, on a real-time basis, based on a sequence of combinations of programmed period and width values and their associated primary period and primary width updates received from a processor,
   wherein the PWM signal includes a sequence of PWM cycles, wherein each PWM cycle includes a PWM signal boundary, and
   wherein each of the received primary period and primary width updates occurs across or within each PWM signal boundary of a current PWM signal being generated, wherein the PWM waveform generator comprises:
      primary period and primary width storage elements, wherein the received period and width values are stored in the primary period and primary width storage elements upon receiving the primary period and primary width updates from the processor, respectively;
      secondary period and secondary width storage elements coupled to the primary period and primary width storage elements, respectively, to receive the period and width values from the primary period and primary width storage elements and to store the received period and width values in the secondary period and secondary width storage elements, respectively, upon receiving a secondary storage element write control signal;
      a tertiary period storage element coupled to the secondary period storage element to receive the period value from the secondary period storage element based on a tertiary period register write signal and to store the period value in the tertiary storage element;
      a down-counter coupled to the secondary width storage element and the tertiary period storage element to receive the width value from the secondary width storage element upon receiving a width update counter signal, wherein the down-counter to countdown the width value in each clock cycle until the down-counter reaches zero, wherein the period value is then loaded into the down-counter from the tertiary period storage element, wherein the down-counter counts down every clock cycle until it reaches zero, and wherein the down-counter generates an EXPIRE signal upon reaching the zero; and
      a final output waveform generator coupled to the down-counter to receive the EXPIRE signal from the down-counter and to generate the PWM signal on a real-time basis.

2. The apparatus of claim 1, wherein the PWM waveform generator further comprises:
   a state machine coupled to the down-counter, final output waveform generator, wherein the state machine is to receive the EXPIRE signal from the down-counter and to generate a state signal.

3. The apparatus of claim 2, wherein the PWM waveform generator further comprises a data bus coupled between the processor and the primary period and primary width storage elements to transmit the period and width values and their associated primary period and primary width updates from the processor to the primary period and primary width storage elements.

4. The apparatus of claim 3, wherein the PWM waveform generator further comprises:
a timing controller coupled to the processor via the data bus and the down-counter to generate the secondary storage element write control signal upon receiving the primary width update from the processor, wherein the timing controller to generate the tertiary period register write signal based on the EXPIRE signal received from the down-counter and the state value received from the state machine, wherein the tertiary period register write signal is a single clock-cycle pulse at the current PWM signal boundary, wherein the final output waveform generator to internally generate expired width and expired period signals using the EXPIRE signal along with the state value, and wherein the timing controller to further generate the width update counter signal based on the expired period signal and a period update counter signal based on the expired width signal.

5. The apparatus of claim 4, wherein the PWM waveform generator further comprises:
a configuration storage element coupled to the processor via the data bus to receive a control signal upon receiving the period and width values from the processor through the data bus and to output a configuration signal, wherein the final output waveform generator generates the PWM signal or an inverse of the PWM signal based on the expired period and width signals and the configuration signal.

6. The apparatus of claim 5, wherein the PWM waveform generator further comprises:
a subtractor coupled between the primary period storage element and the secondary period storage element and further coupled to the primary width storage element, wherein the subtractor to receive the width value from the primary width storage element and the period value from the primary period storage element and to compute a secondary period value using the received period and width values, wherein the tertiary storage element is to receive the secondary period value upon receiving the tertiary period register write signal from the timing controller, and wherein the down-counter is to receive the secondary period value from the tertiary period storage element upon receiving the period update counter signal and to output the EXPIRE signal corresponding to the expired period signal.

7. An apparatus for generating a (pulse width modulated) PWM waveform based on a sequence of combinations of programmed period and width values received from a processor, comprising:
a primary period storage element to store a current programmed period value upon receiving a primary period storage element write signal from the processor;
a primary width storage element to store a current programmed width value upon receiving a primary width storage element write signal from the processor;
a down-counter to generate an EXPIRE signal upon reaching a zero value;
a state machine to receive the EXPIRE signal from the down-counter and to generate a state signal;
a timing controller to receive the primary width storage element write signal from the processor and to output a secondary storage element write control signal upon receiving the primary width storage element write signal, wherein the timing controller to generate a tertiary period register write signal based on the EXPIRE and the state signals, and wherein the timing controller to further generate a width update counter signal and a period update counter signal based on the EXPIRE and the state signals;
a secondary width storage element to receive the current width value from the primary width storage element upon receiving the secondary storage element write control signal;
a subtractor to receive the current period and width values from the primary period storage element and the primary width storage element, respectively, and to output a secondary period value;
a secondary period storage element to receive the secondary period value from the subtractor upon receiving the secondary storage element write control signal;
a tertiary period register to receive the secondary period value from the secondary period storage element upon receiving the tertiary period register write signal from the timing controller, wherein the down-counter is to receive the current width value upon receiving the width update counter signal and to receive the secondary period value from the tertiary period register upon receiving the period update counter signal and to output the EXPIRE signal; and
a final output waveform generator to output a current PWM waveform based on the EXPIRE signal and the state signal.

8. The apparatus of claim 7, further comprising:
a configuration register to receive a control signal from the processor upon outputting the period and width values and to output a configuration signal, wherein the final output waveform generator to output the PWM waveform or its inverse based on the configuration signal.

9. The apparatus of claim 8, wherein the final output waveform generator to generate the PWM waveform having a width of one clock cycle and a period of two clock cycles.

10. The apparatus of claim 7, further comprising:
a DSP core; and
a bus coupled between the DSP core and the primary period register, the primary width register, and the configuration register to transmit the primary period value and the primary width value from the DSP core to the primary period register and the primary width register, respectively.

11. The apparatus of claim 7, wherein the primary period and primary width storage elements are memory-mapped registers.

12. A DSP system-on-chip (SoC) for generating a real-time distortionless PWM signal comprising:
a DSP core to receive current programmed period and width values and their associated period and width update signals from an user program;
a data bus coupled to the core;
primary period and primary width registers coupled to the data bus to store the current programmed period and width values in the primary period and primary width registers upon receiving the period and width write signals, respectively, from the DSP core via the data bus;

secondary period and secondary width registers coupled to the primary period and primary width registers, respectively, to receive the current programmed period and width values from the primary period and primary width registers upon receiving a secondary storage element write control signal;

a tertiary period register coupled to the secondary period register to store the period value at a beginning boundary of a cycle of the PWM signal;

a down-counter coupled to the secondary width register and the tertiary period register to receive the current programmed width value at the beginning boundary of the PWM signal, wherein the period value is then loaded into the down-counter from the tertiary period storage element, wherein the down-counter counts down every clock cycle until it reaches zero, and wherein the down-counter generates an EXPIRE signal upon reaching the zero; and a final output waveform generator coupled to the down-counter to receive the EXPIRE signal and to generate the PWM signal.

13. The DSP SoC of claim 12, further comprising:
a subtractor coupled to the primary period and primary width registers and the secondary period register to receive the current programmed period and programmed width values from the primary period and primary width registers and to generate a secondary period value by subtracting the current programmed width value from the current programmed period value.

14. The DSP SoC of claim 13, further comprising:
a timing controller coupled to the data bus, the down-counter, the secondary period and secondary width registers, and the tertiary period register, to generate the secondary storage element write control signal upon receiving the width write signal from the DSP core via the data bus, wherein the timing controller to receive the secondary period value and the current programmed width value and to generate a tertiary period register write signal based on the EXPIRE signal, and wherein the timing controller to further generate a width write counter signal based on the current programmed width value and a period write counter signal based on the secondary period value.

15. The DSP SoC of claim 14, further comprising a state machine coupled to the timing controller, the down-counter, and the final output waveform generator to receive the EXPIRE signal from the down-counter and to generate a state signal, wherein the final output waveform generator to internally generate expired width and expired period signals using the EXPIRE signal and the state signal.

16. The DSP SoC of claim 14, wherein the down-counter to generate the EXPIRE signal corresponding to an expired width value based on the current programmed width value upon receiving the width write counter signal from the timing controller, and wherein the down-counter to receive the secondary period value from the tertiary period register upon generating the EXPIRE signal and to again generate the EXPIRE signal based on the secondary period value upon receiving the period write counter signal.

17. The DSP SoC of claim 16, further comprising:
a configuration register coupled to the data bus and the final output waveform register to receive a control signal from the processor upon outputting the period and width values and to output a configuration signal, wherein the final output waveform generator to generate the PWM signal or an inverse of the PWM signal based on the configuration signal.

18. An audio processor comprising a system-on-chip (SoC), wherein the SoC comprises:
primary period and primary width storage elements, wherein received period and width values are stored in the primary period and primary width storage elements upon receiving period and width updates from the audio processor, respectively;

secondary period and secondary width storage elements coupled to the primary period and primary width storage elements, respectively, to receive the primary and width values from the primary period and primary width storage elements and store in the secondary period and secondary width storage elements, respectively, upon receiving the width update;

a tertiary period storage element coupled to the secondary period storage element to receive the period value from the secondary period storage element based on a tertiary period register write signal and to store the period value in the tertiary storage element;

a down-counter coupled to the secondary width storage element and the tertiary period storage element to receive the width value from the secondary width storage element upon receiving a width write counter signal, wherein the down-counter to generate an EXPIRE signal upon reaching a zero value; and a final output waveform generator coupled to the down-counter to receive the EXPIRE signal from the down-counter and to generate the PWM signal on a real-time basis.

19. The audio processor of claim 18, wherein the primary period and primary width storage elements are memory mapped registers.

20. A microcontroller for generating a distortionless PWM signal on a real-time basis comprising:
means for storing a programmed period value upon receiving a primary period storage element write signal from a microcontroller core;

means for storing a programmed width value upon receiving a primary width storage element write signal from the microcontroller core;

means for counting down the period and width values and generate an expired period signal and an expired width signal;

means for receiving the primary width storage element write signal from the microcontroller core and to output a secondary storage element write control signal upon storing the width value, wherein the means for receiving the primary width storage element write signal generates a tertiary period register write signal based on the expired period signal, and wherein the means for receiving the primary width storage element write signal further generates a width update counter signal based on the expired period signal and a period update counter signal based on the expired width signal;

means for receiving the width value upon receiving the secondary storage element write control signal;

means for receiving the period and width values and subtract the width value from the period value and to output a secondary period value;

means for receiving the secondary period value upon receiving the secondary storage element write control signal;

means for receiving the secondary period value upon receiving the tertiary period register write signal;

means for receiving the width value upon receiving the width update counter signal and to further receive the secondary period value upon receiving the period update counter signal and to output the expired width signal based on received width value and the expired period signal based on the secondary period value; and means for outputting the PWM signal based on the expired period and width signals.

21. The microcontroller of claim 20, further comprising:

means for receiving the period and width values from the microcontroller core and to output a configuration signal, wherein the means for outputting the PWM signal generates the PWM signal based on the configuration signal.

22. A method for generating a predictable pulse width modulated (PWM) signal on a real-time basis based on a sequence of combinations of the programmed period and width values, wherein each of the received combinations of the programmed period and width write updates occurs across or within a PWM signal boundary of a current PWM signal being generated, comprising:

receiving the sequence of combinations of the programmed period and width values and their associated primary period and width write signals;

storing each of the programmed period and width values in primary period and width registers, upon receiving the primary period write and width write signals, respectively;

storing the programmed width value by obtaining the programmed width value from the primary width register into a secondary width register upon receiving a secondary storage element write control signal;

computing a secondary period value by subtracting the programmed width value from the programmed period value; storing the secondary period value into a secondary period register upon receiving the secondary storage element write control signal;

storing the secondary period value in a tertiary period register upon receiving a tertiary period register write signal;

loading a down-counter with the programmed width value by obtaining the programmed width value from the secondary width register upon receiving the width update counter signal;

counting the loaded programmed width value each clock signal to produce an expired width signal;

loading the secondary period value into the down-counter upon producing the expired width signal and upon receiving a period update counter signal;

counting the loaded secondary period value each clock signal to produce an expired period signal; and generating the PWM signal based on the expired period and width signals.

23. The method of claim 22, further comprising:

generating a configuration signal upon receiving a control signal; and generating the PWM signal based on the configuration signal and the expired period and width signals.

24. The method of claim 22, wherein counting the loaded programmed width value according to width timing signal to produce the expired width signal comprises:

loading the programmed width value corresponding to the width update counter signal; and counting down the loaded programmed width value with each clock cycle until the down-counter reaches zero and then to produce the expired width signal.

25. The method of claim 22, wherein counting the loaded secondary period value according to a period timing signal to produce the expired period signal comprises:

loading the programmed secondary period value corresponding to the period update counter signal; and counting down the loaded secondary period value with each clock cycle until the down-counter reaches zero and then to produce the expired period signal.

26. The method of claim 22, further comprising:

generating the secondary storage element write control signal upon receiving the primary width register write signal; and generating the tertiary period register write signal based on the expired period signal.

* * * * *